United States Patent
Tian et al.

(10) Patent No.: US 11,058,030 B2
(45) Date of Patent: Jul. 6, 2021

(54) COLD PLATE WITH FLEX REGIONS BETWEEN FIN AREAS

(71) Applicant: International Business Machines Corporation, Armonk, NY (US)

(72) Inventors: Shurong Tian, Mount Kisco, NY (US); Todd E. Takken, Brewster, NY (US)

(73) Assignee: International Business Machines Corporation, Armonk, NY (US)

(*) Notice: Subject to any disclaimer, the term of this patent is extended or adjusted under 35 U.S.C. 154(b) by 46 days.

(21) Appl. No.: 16/391,233

(22) Filed: Apr. 22, 2019

(65) Prior Publication Data

US 2020/0337181 A1 Oct. 22, 2020

(51) Int. Cl.
*H05K 7/20* (2006.01)
*H05K 1/02* (2006.01)
*F28F 3/12* (2006.01)
*H05K 1/14* (2006.01)

(52) U.S. Cl.
CPC ......... *H05K 7/20254* (2013.01); *F28F 3/12* (2013.01); *H05K 1/0203* (2013.01); *H05K 7/20272* (2013.01); *H05K 7/20518* (2013.01); *F28F 2255/02* (2013.01); *H05K 1/14* (2013.01); *H05K 2201/10545* (2013.01)

(58) Field of Classification Search
CPC ............ H05K 7/20254; H05K 1/0203; H05K 7/20272; H05K 7/20518; H05K 1/14; F28F 3/12; F28F 2255/02
USPC ....................................... 165/80.4
See application file for complete search history.

(56) References Cited

U.S. PATENT DOCUMENTS

| | | |
|---|---|---|
| 5,150,274 A | 9/1992 | Okada et al. |
| 5,168,348 A | 12/1992 | Chu et al. |
| 5,201,866 A * | 4/1993 | Mok .................. F28F 3/02 165/185 |
| 5,453,911 A | 9/1995 | Wolgemuth et al. |
| 5,920,457 A | 7/1999 | Lamb et al. |
| 6,400,012 B1 | 6/2002 | Miller et al. |
| 6,411,512 B1 | 6/2002 | Mankaruse et al. |
| 6,504,720 B2 | 1/2003 | Furuya |
| 6,549,411 B1 | 4/2003 | Herbert |
| 6,982,877 B2 | 1/2006 | Vinson et al. |
| 7,385,821 B1 | 6/2008 | Feierbach |
| 7,547,582 B2 | 6/2009 | Brunschwiler et al. |
| 8,069,907 B2 | 12/2011 | Bryant et al. |
| 8,736,048 B2 | 5/2014 | Schultz |
| 9,213,378 B2 | 12/2015 | Anderl et al. |
| 9,425,124 B2 | 8/2016 | Karidis et al. |
| 9,894,801 B1 | 2/2018 | Marroquin et al. |

(Continued)

OTHER PUBLICATIONS

Harrison, Alan, "List of IBM Patents or Patent Applications Treated As Related", Apr. 2019, pp. 1-2.

*Primary Examiner* — Davis D Hwu
(74) *Attorney, Agent, or Firm* — Daniel Morris; Otterstedt, Wallace & Kammer, LLP

(57) ABSTRACT

An apparatus includes a top wall and a bottom wall. The top wall and the bottom wall define and enclose a first fin area; a second fin area; and a flex region joining the first fin area to the second fin area. The flex region is connected in fluid communication with the interior of the first fin area and the interior of the second fin area. The flex region is bent or twisted at a nonzero angle around at least one axis relative to the broadest surfaces of the first and second fin areas.

20 Claims, 11 Drawing Sheets

(56) References Cited

U.S. PATENT DOCUMENTS

| | | |
|---|---|---|
| 10,222,125 B2 | 3/2019 | Coteus et al. |
| 2008/0237847 A1 | 10/2008 | Nakanishi et al. |
| 2009/0151907 A1 | 6/2009 | Karidis et al. |
| 2011/0266897 A1* | 11/2011 | Le Besnerais ............ H02K 1/20 310/62 |
| 2012/0082880 A1 | 4/2012 | Koetting et al. |
| 2013/0214406 A1 | 8/2013 | Schultz |
| 2014/0162107 A1 | 6/2014 | Obrist et al. |
| 2014/0299295 A1* | 10/2014 | Kalbacher ................. F28F 9/26 165/76 |
| 2015/0369545 A1 | 12/2015 | Naritomi et al. |
| 2016/0056088 A1 | 2/2016 | Uhlemann et al. |
| 2016/0084589 A1* | 3/2016 | Sunder .................... F28F 13/12 62/643 |
| 2016/0091260 A1 | 3/2016 | Schultz |
| 2016/0290728 A1 | 10/2016 | Coteus et al. |
| 2016/0376744 A1* | 12/2016 | Lv ........................... D06F 25/00 34/73 |
| 2018/0027696 A1 | 1/2018 | Franz et al. |
| 2018/0124949 A1 | 5/2018 | Marroquin et al. |
| 2018/0263137 A1 | 9/2018 | Jensen et al. |
| 2019/0096785 A1 | 3/2019 | Walczyk et al. |

* cited by examiner

COLD PLATE WITH FLEX REGIONS BETWEEN FIN AREAS

BACKGROUND

The present invention relates to the electrical, electronic, and computer arts, and more specifically, to cooling of electronic components.

Conventionally, electronic components have been assembled in relatively simple configurations, e.g., coplanar on one side of a common printed circuit board. However, increasing complexity of circuit design and desire to save space within server racks have motivated more complex configurations of electronic components, e.g., mounted to opposed sides of a printed circuit board or mounted to circuit boards that are arranged at angles to each other (e.g., perpendicular) or that are offset from each other (e.g., by a distance greater than the heights of the components on the circuit boards).

SUMMARY

Principles of the invention provide a cold plate with flex regions between fin areas.

In one aspect, an exemplary apparatus includes a continuous top wall and a continuous bottom wall. The top wall and the bottom wall define and enclose a first fin area, a second fin area, and a flex region that joins the first fin area to the second fin area. The flex region is bent or twisted at a nonzero angle around at least one axis relative to the broadest surfaces of the first and second fin areas. The flex region and the fin areas are connected in fluid communication with each other.

In another aspect, another exemplary apparatus includes a continuous top wall and a continuous bottom wall. The top wall and the bottom wall define and enclose a first fin area; a second fin area; and a flex region joining the first fin area to the second fin area. The flex region is bent at a nonzero angle around at least one axis parallel to the broadest surfaces of the first and second fin areas. One or more support posts are disposed in the flex region, are connected to at least one of the top wall and the bottom wall, and hold the top wall apart from the bottom wall. The flex region and the fin areas are connected in fluid communication with each other.

In another aspect, another exemplary apparatus includes a continuous first wall; a continuous second wall; and a joint that connects an edge of the first wall to an edge of the second wall. At the joint the edge of the first wall protrudes beyond the edge of the second wall and is bent to cover the edge of the second wall with space therebetween to accommodate solder or braze material.

In view of the foregoing, techniques of the present invention can provide substantial beneficial technical effects. For example, one or more embodiments provide one or more of:

Reduced material requirements for cooling multiple electronic components in complex configurations.

Ease of installing and removing multi-fin-area cold plates onto complex configurations of electronic components.

Ease of connecting cold plates for cooling multiple electronic components in complex configurations.

Overall, the technology of this disclosure allows a thermal and mechanical design engineer to make a lower cost and/or better thermal performance system. Being able to bend flex regions of a single cold plate in unusual angles while retaining mechanical tolerance allows lower cost designs with high system packaging density at equivalent thermal performance.

These and other features and advantages of the present invention will become apparent from the following detailed description of illustrative embodiments thereof, which is to be read in connection with the accompanying drawings.

DETAILED DESCRIPTION

Embodiments of the disclosure enable previously unknown configurations of multi-fin-area cold plates for cooling complex arrangements of heat generating devices such as electronic components.

Figure 1:
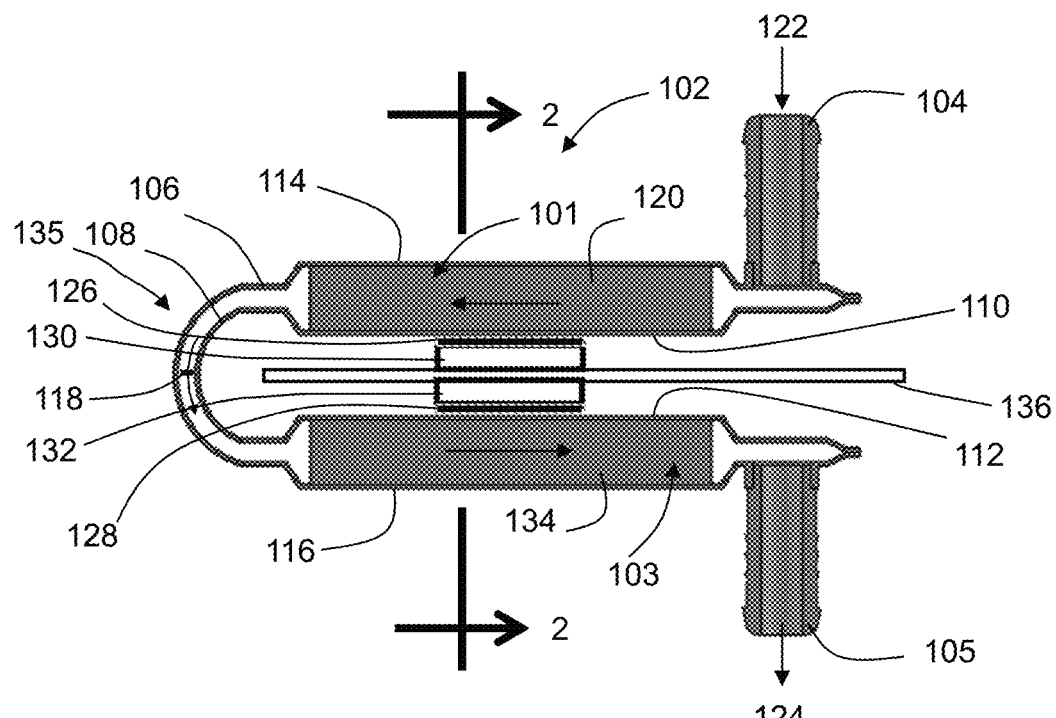
FIG. 1 shows a cross-sectional side view of a cold plate having a 180 degree flex region in between fin areas, according to an exemplary embodiment.

For example, certain embodiments of the disclosure enable a single cold plate to be used for cooling an arrangement of electronic components in which the components are stacked together on opposed sides of a printed circuit board. Accordingly, FIG. 1 shows a cross-sectional side view of a cold plate 102 that has a 180 degree flex region 135 in between fin areas 101, 103 along the liquid flow direction devices in order to cool two heat generating devices 130 and 132. The cold plate 102 comprises barb fittings 104 and 105, top wall 106, 114 and 116 which can be one continuous sheet metal or separate sections and bottom wall 108, 110 and 112 which can be made of one continuous sheet metal or separate sections, as well as cold plate fins 120 and 134 which can be made of folded sheet metal fins or machined fins or pins or other conductive structures. In between the fins 120 and 134, the top wall 106 and bottom wall 108 comprise a 180 degree flex region 135. In order to prevent collapse of the liquid flow path during bending of the flex region 135, and in order to prevent a burst during burst pressure test, one or more support posts 118 are provided between the top wall 106 and the bottom wall 108 at the flex region 135.

Two heat generating devices 130 and 132, are stacked vertically one relative to the other, and are electrically connected through a printed circuit board (PCB) 136. These two heat generating devices dissipate their heat through thermal interface material 126 and 128 to cold plate bottom wall 108, 110, 112, cold plate fins 120, 134, and to the cold plate liquid, respectively. The cold plate liquid flows from liquid entrance 122 through the cold plate 102 to liquid exit 124.

Figure 2:
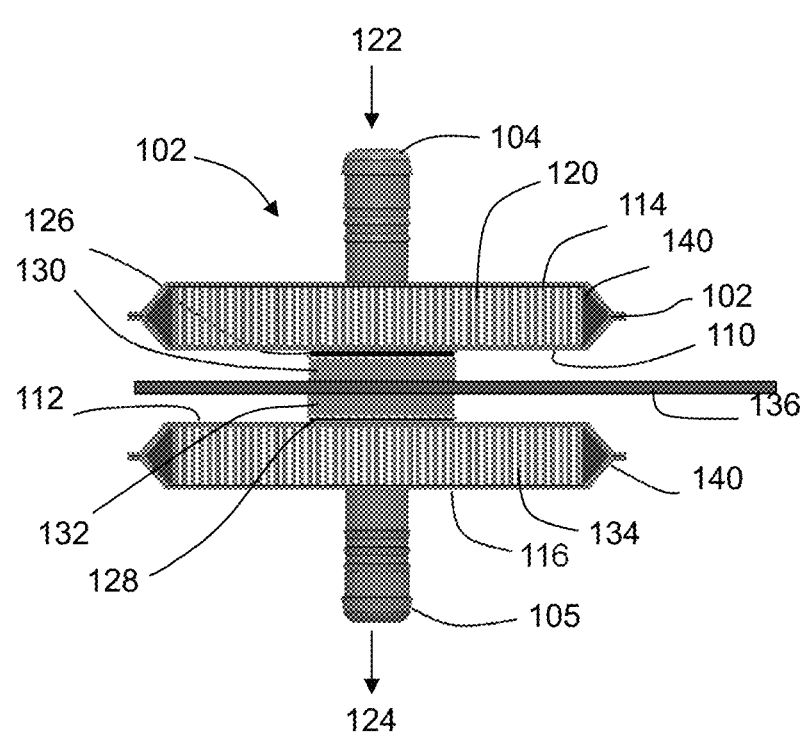
FIG. 2 shows a cross-sectional end view of FIG. 1, perpendicular to the liquid flow direction, taken along line 2-2 of FIG. 1.

FIG. 2 shows a cross-sectional end view perpendicular to the liquid flow direction. Similarly to FIG. 1, the heat generating devices 130 and 132 dissipate their heat through the same thermal path as described in FIG. 1. A blocker 140 prevents fluid bypassing the fins 120, 134.

Figure 3:
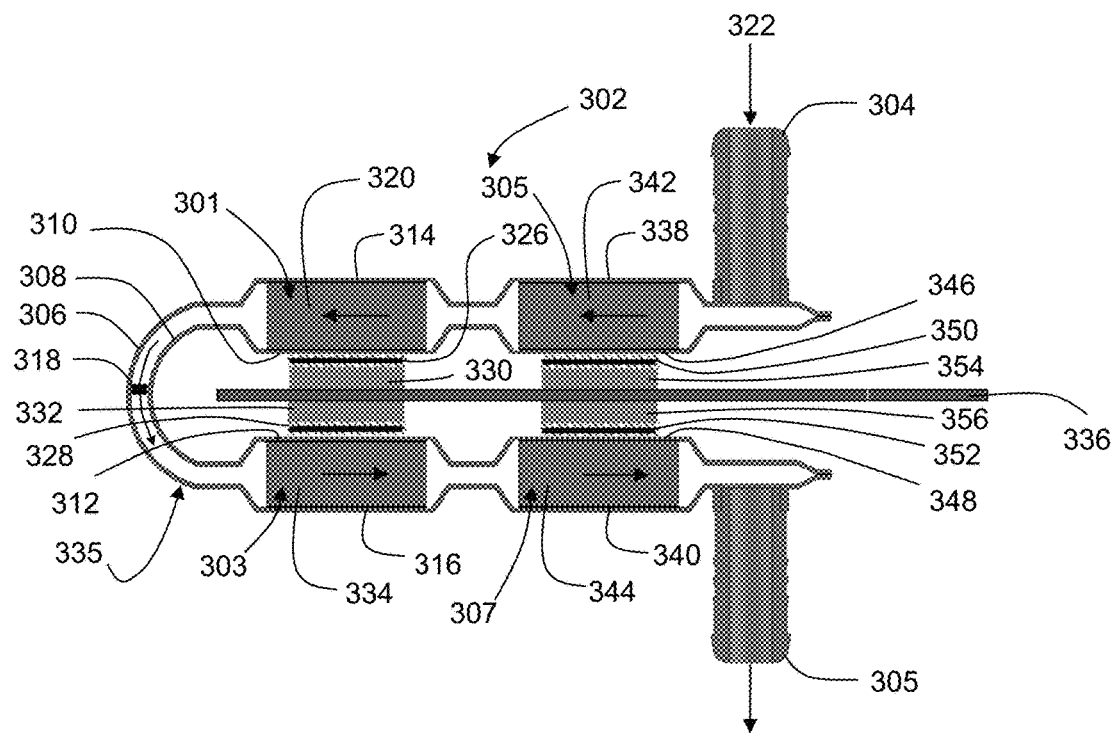
FIG. 3 shows a cross-sectional side view of a cold plate having a 180 degree flex region in between fin areas, according to another exemplary embodiment.

According to another exemplary embodiment, FIG. 3 shows a cross-sectional side view of a cold plate 302 that has a 180 degree flex region 335 in between fin areas 301, 303, 305, 307 along the liquid flow direction in order to cool four heat generating devices 330, 332, 354 and 356. The cold plate 302 comprises barb fittings 304 and 305, top wall 306, 314, 316, 338 and 340 which can be one continuous sheet metal or separate sections and bottom wall 308, 310, 312, 346 and 348 which can be made of one continuous sheet metal or separate sections, cold plate fins 320, 334, 342 and 344 which can be made of folded sheet metal fins or machined fins and support posts 318 in between the top wall 306 and bottom wall 308. In between the fins 320 and 334, the top wall 306 and bottom wall 308 comprise a 180 degree flex region. In order to prevent collapse of the liquid flow path during bending of the flex region 335 and in order to prevent a burst during burst pressure test, one or more support posts 318 are provided within the flex region 335.

Four heat generating devices 330, 332, 354 and 356 are arranged with 330 and 354 on the top of a printed circuit board (PCB) 336 and with 332 and 356 arranged on the bottom of the printed circuit board (PCB) 336, with 330, 332 arranged in a first vertical stack and with 354 and 356 arranged in a second vertical stack. These four heat generating devices dissipate their heat through thermal interface material 326, 328, 350 and 352, cold plate bottom wall 310, 312, 346 and 348, and cold plate fins 320, 334, 342 and 344 into the cold plate liquid. The cold plate liquid flows from liquid entrance 322 through the cold plate 302 to liquid exit 324.

Figure 4:
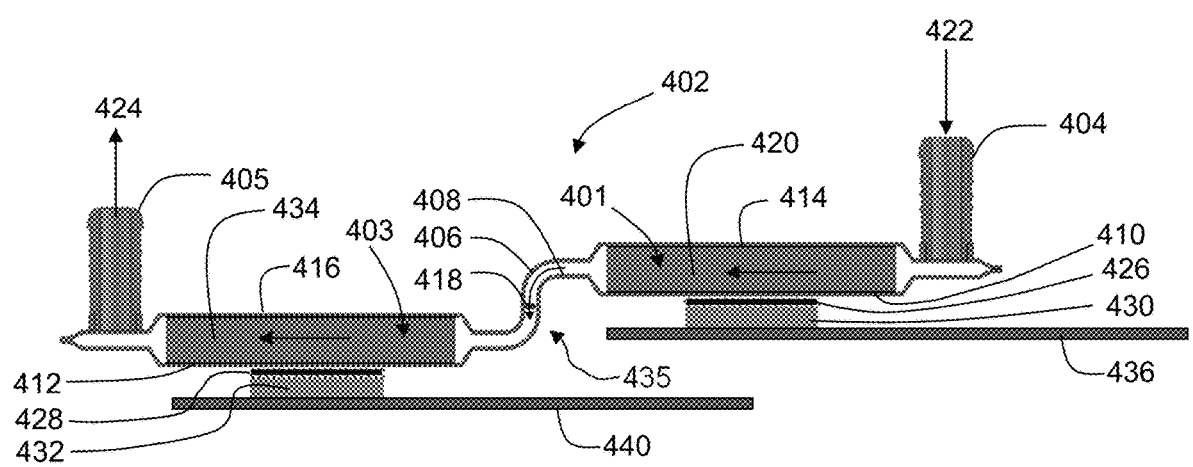
FIG. 4 shows a cross-sectional side view of a cold plate having multiple bends in between fin areas, according to another exemplary embodiment.

According to another exemplary embodiment, FIG. 4 shows a cross-sectional side view of a cold plate 402 that has multiple bends in between fin areas 401, 403 in order to cool two heat generating devices 430 and 432 which have an offset one relative to the other. The heat generating devices are arranged on the respective tops of two printed circuit boards (PCBs) 436, 440. The cold plate 402 comprises barb fittings 404 and 405, top wall 406, 414, and 416 which can be one continuous sheet metal or separate sections and bottom wall 408, 410 and 412 which can be made of one continuous sheet metal or separate sections, cold plate fins 420 and 434 which can be made of folded sheet metal fins or machined fins and support posts 418 in between the top wall 406 and bottom wall 408. In between the fins 420 and 434, the top wall 406 and bottom wall 408 comprise a recurved flex region 435. In order to prevent collapse of the liquid flow path during bending of the flex region 435 and in order to prevent a burst during burst pressure test, one or more support posts 418 are provided within the flex region 435. The heat generating devices dissipate their heat through thermal interface material 426, 428, cold plate bottom wall 408, 410 and 412, and cold plate fins 420, 434 into the cold plate liquid. The cold plate liquid flows from liquid entrance 422 through the cold plate 402 to liquid exit 424.

Figure 5:
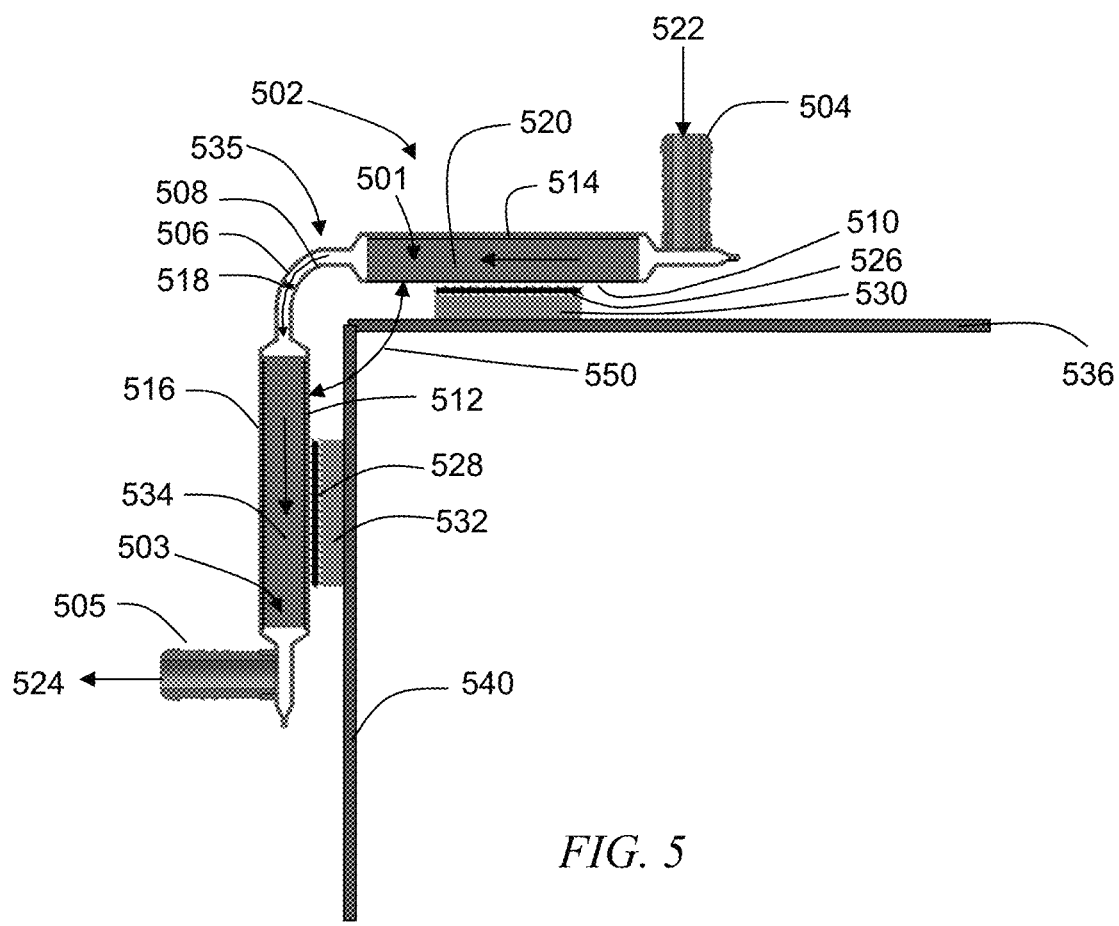
FIG. 5 shows a cross-sectional side view of a cold plate having a 90 degree flex region in between fin areas.

According to yet another exemplary embodiment, FIG. 5 shows a cross-sectional side view of a cold plate 502 that has a 90 degree (angle 550) flex region in between fin areas 501, 503 along the liquid flow direction in order to cool two heat generating devices 530 and 532. The heat generating devices are arranged on the respective tops of two printed circuit boards (PCBs) 536, 540. The cold plate 502 comprises barb fittings 504 and 505, top wall 506, 514 and 516 which can be one continuous sheet metal or separate sections and bottom wall 508, 510 and 512 which can be made of one continuous piece of sheet metal or separate sections, cold plate fins 520 and 534 which can be made of folded sheet metal fins or machined fins and support posts 518 in between the top wall 506 and bottom wall 508. In between the fins 520 and 534, the top wall 506 and bottom wall 508 comprise a 90 degree flex region 535. In order to prevent collapse of the liquid flow path during bending of the flex region 535 and in order to prevent a burst during burst pressure test, one or more support posts 518 are provided within the flex region 535.

Generally, the support posts 118, 318, 418, or 518 can be connected to either or both of the respective top walls and bottom walls. In one or more embodiments, the one or more support posts are connected only to the bottom wall and leave the top wall free to deform in tension as the flex region is bent. The posts will not need to provide burst prevention in some geometries. Therefore, posts will not need to attach to both top and bottom walls in all cases.

The two heat generating devices 530 and 532 are electrically connected through the printed circuit board (PCBs) 536, 540. These two heat generating devices dissipate their heat through thermal interface material 526 and 528 to cold plate bottom wall 508, 510, 512, cold plate fins 520, 534, and to the cold plate liquid, respectively. The cold plate liquid flows from liquid entrance 522 through the cold plate 502 to liquid exit 524.

Figure 6:
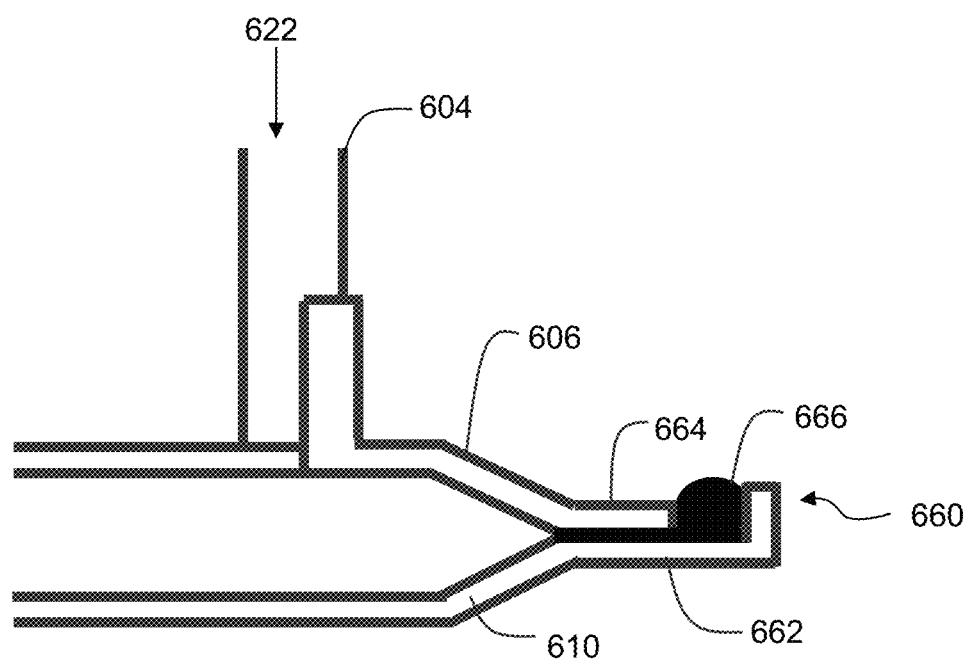
FIG. 6 shows a cross-sectional side view of an asymmetric solder or braze joint, according to an exemplary embodiment.

Furthermore, aspects of the disclosure provide for enhanced sealing between walls of a cold plate that is subject to bending during assembly and/or installation, generally as discussed above. Accordingly, FIG. 6 shows a cross-sectional side view of an asymmetric solder or braze joint 660 between a cold plate top wall 606 and a bottom wall 610. A barb fitting 604 permits liquid flow from a liquid supply 622 into the volume that is sealed by the joint 660. The top wall 606 and bottom wall 610 are soldered or brazed together with an edge 662 of the bottom wall 610 extending beyond an edge 664 of the top wall 606, in order to introduce more solder or braze materials 666 between the top and bottom wall edges in order to prevent potential water leakage and to increase burst pressure. Although as shown it is the edge of the bottom wall 610 that extends further out, equally, the edge of the top wall 606 can protrude. In one or more embodiments, the protruding edge 662 is bent upward to provide additional sealing area for forming the solder or braze joint 660 between the protruding edge 662 and the edge 664 of the top wall 606.

Figure 7:
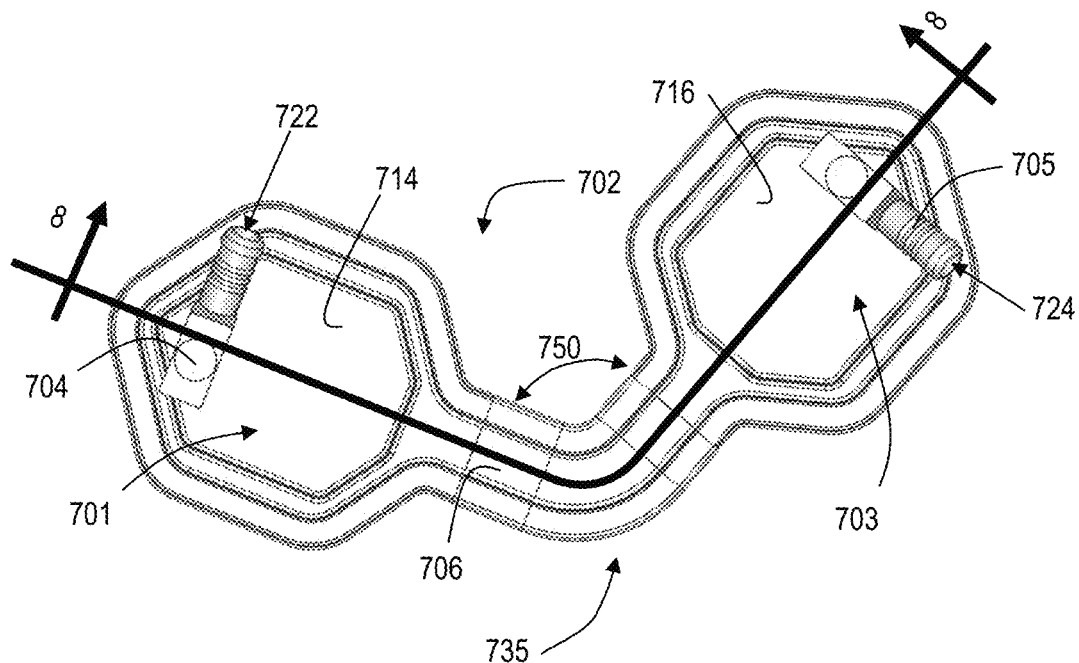
FIG. 7 shows a perspective view of a cold plate having multiple fin areas joined by a bend around an axis perpendicular to the broadest surfaces of the fin areas, according to an exemplary embodiment.
Figure 8:
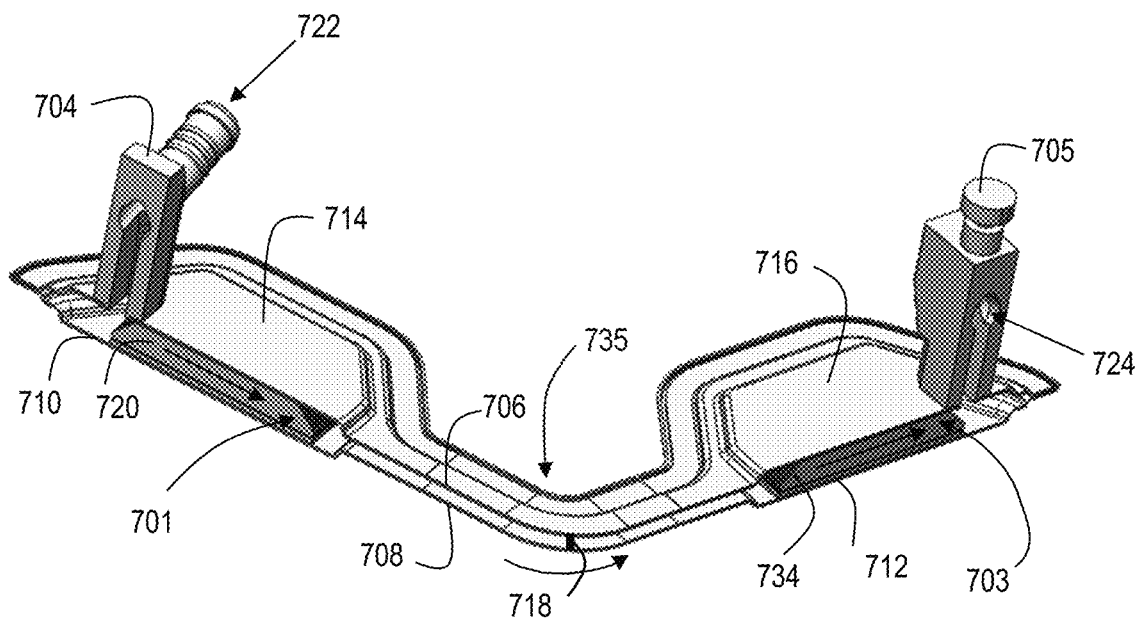
FIG. 8 shows a cross-sectional view of the cold plate of FIG. 7, taken along line 8-8 of FIG. 7.

According to another embodiment, FIGS. 7 and 8 show a perspective view and a cross-sectional view of a cold plate 702 that has multiple fin areas 701, 703 that are joined by a flex region 735 that is bent around an axis perpendicular to the broadest surfaces of the fin areas. The cold plate 702 comprises barb fittings 704 and 705, top wall 706, 714, and 716 which can be one continuous sheet metal or separate sections and bottom wall 708, 710 and 712 which can be made of one continuous sheet metal or separate sections, cold plate fins 720 and 734 which can be made of folded sheet metal fins or machined fins and support posts 718 in between the top wall 706 and bottom wall 708. In between the fins 720 and 734, the top wall 706 and bottom wall 708 comprise a bent flex region 735. In order to prevent collapse of the liquid flow path during bending of the flex region 735 and in order to prevent a burst during burst pressure test, one or more support posts 718 are provided within the flex region 735. Heat generating devices dissipate heat through cold plate bottom wall 708, 710 and 712, and cold plate fins 720, 734 into the cold plate liquid. The cold plate liquid flows from liquid entrance 722 through the cold plate 702 to liquid exit 724. The flex region 735 is bent at an angle 750.

Figure 9:
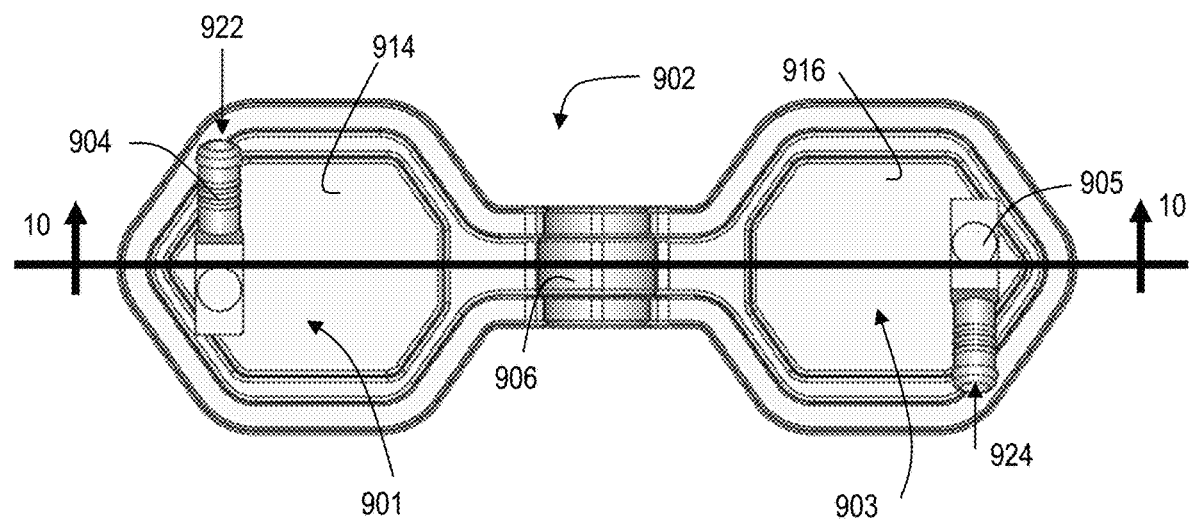
FIG. 9 shows a top view of a cold plate having multiple fin areas joined by a bend around an axis parallel to the broadest surfaces of the fin areas, according to an exemplary embodiment.
Figure 10:
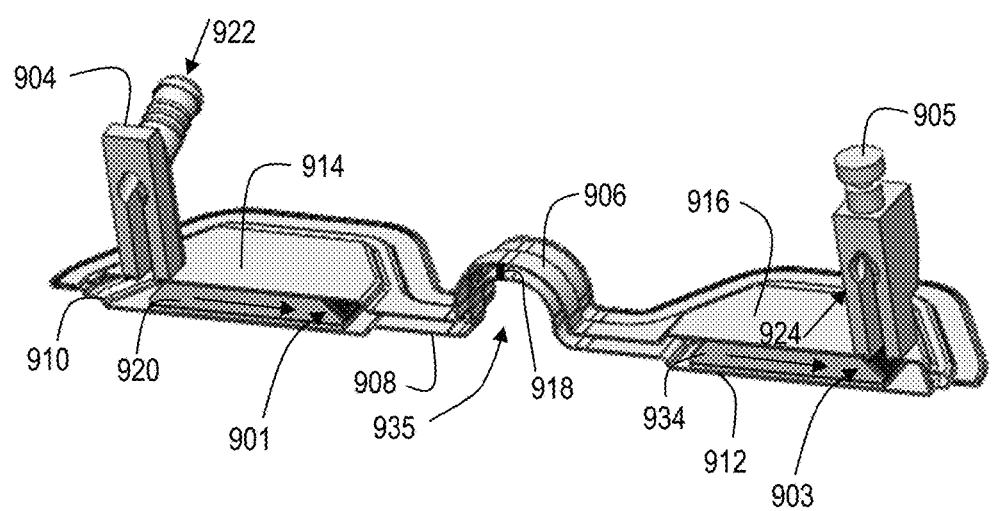
FIG. 10 shows a cross-sectional view of the cold plate of FIG. 9, taken along line 10-10 of FIG. 9.

According to another embodiment, FIGS. 9 and 10 show a perspective view and a cross-sectional view of a cold plate 902 that has multiple fin areas 901, 903 joined by a flex region 935 that is bent around an axis parallel to the broadest surfaces of the fin areas. The cold plate 902 comprises barb fittings 904 and 905, top wall 906, 914, and 916 which can be one continuous sheet metal or separate sections and bottom wall 908, 910 and 912 which can be made of one continuous sheet metal or separate sections, cold plate fins 920 and 934 which can be made of folded sheet metal fins or machined fins and support posts 918 in between the top wall 906 and bottom wall 908. In between the fins 920 and 934, the top wall 906 and bottom wall 908 comprise a bent flex region 935. In order to prevent collapse of the liquid flow path during bending of the flex region 935, one or more support posts 918 are provided within the flex region 935. In one or more embodiments, the support posts 918 also serve to prevent a burst during burst pressure test. Heat generating devices dissipate heat through cold plate bottom wall 908, 910 and 912, and cold plate fins 920, 934 into the cold plate liquid. The cold plate liquid flows from liquid entrance 922 through the cold plate 902 to liquid exit 924.

Figure 11:
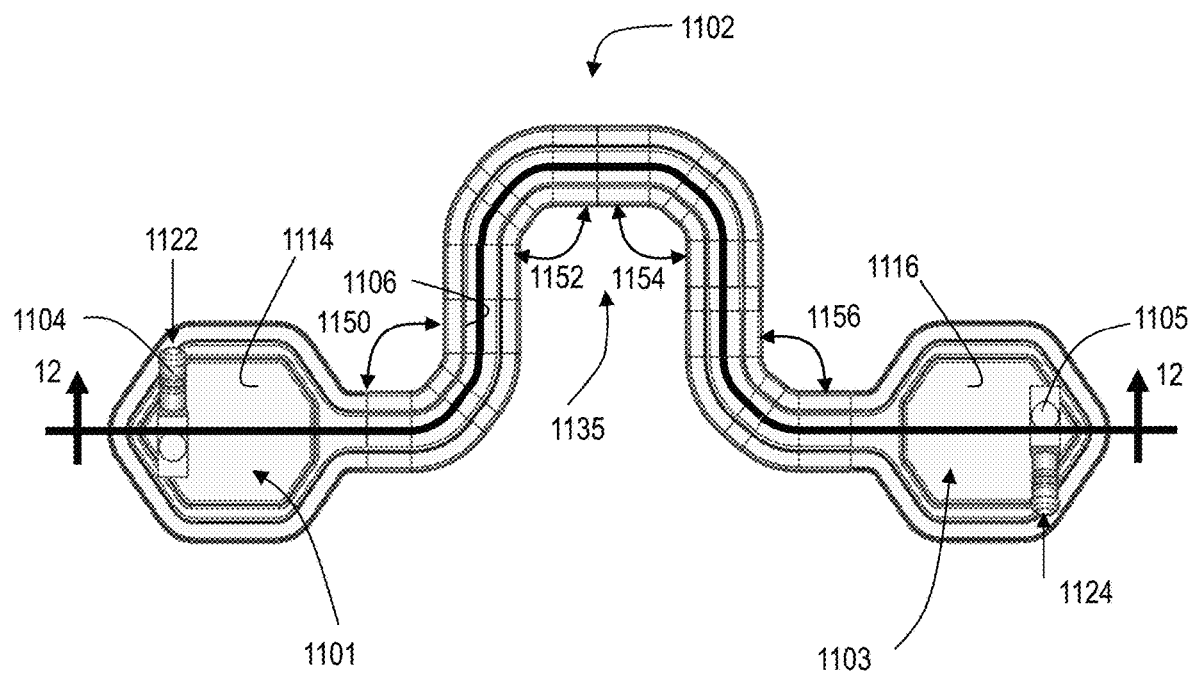
FIG. 11 shows a top view of a cold plate having multiple fin areas joined by multiple bends around axes perpendicular to the broadest surfaces of the fin areas, according to an exemplary embodiment.
Figure 12:
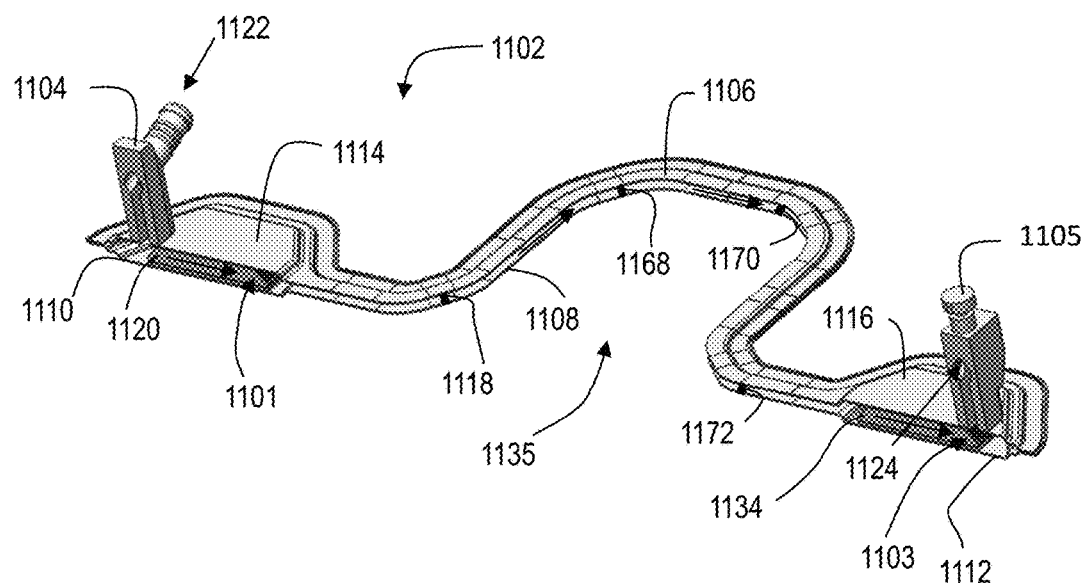
FIG. 12 shows a cross-sectional view of the cold plate of FIG. 11, taken along line 12-12 of FIG. 11.

FIG. 11 shows a top view of a cold plate 1102 that has multiple fin areas 1101, 1103 that are joined by multiple bends 1150, 1152, 1154, 1156 around axes perpendicular to the broadest surfaces of the fin areas, according to an exemplary embodiment. FIG. 12 shows a cross-sectional view of the cold plate 1102 of FIG. 11. The cold plate 1102 comprises barb fittings 1104 and 1105, top wall 1106, 1114, and 1116 which can be one continuous sheet metal or separate sections and bottom wall 1108, 1110 and 1112 which can be made of one continuous sheet metal or separate sections, cold plate fins 1120 and 1134 which can be made of folded sheet metal fins or machined fins and support posts 1118, 1168, 1170, 1172 in between the top wall 1106 and bottom wall 1108. In between the fins 1120 and 1134, the top wall 1106 and bottom wall 1108 comprise a bent flex region 1135. In order to prevent collapse of the liquid flow path during bending of the flex region 1135, one or more support posts 1118, 1168, 1170, 1172 are provided within the flex region 1135. In one or more embodiments, the support posts 1118, 1168, 1170, 1172 also serve to prevent a burst during burst pressure test. Heat generating devices dissipate heat through cold plate bottom wall 1108, 1110 and 1112, and cold plate fins 1120, 1134 into the cold plate liquid. The cold plate liquid flows from liquid entrance 1122 through the cold plate 1102 to liquid exit 1124.

Figure 13:
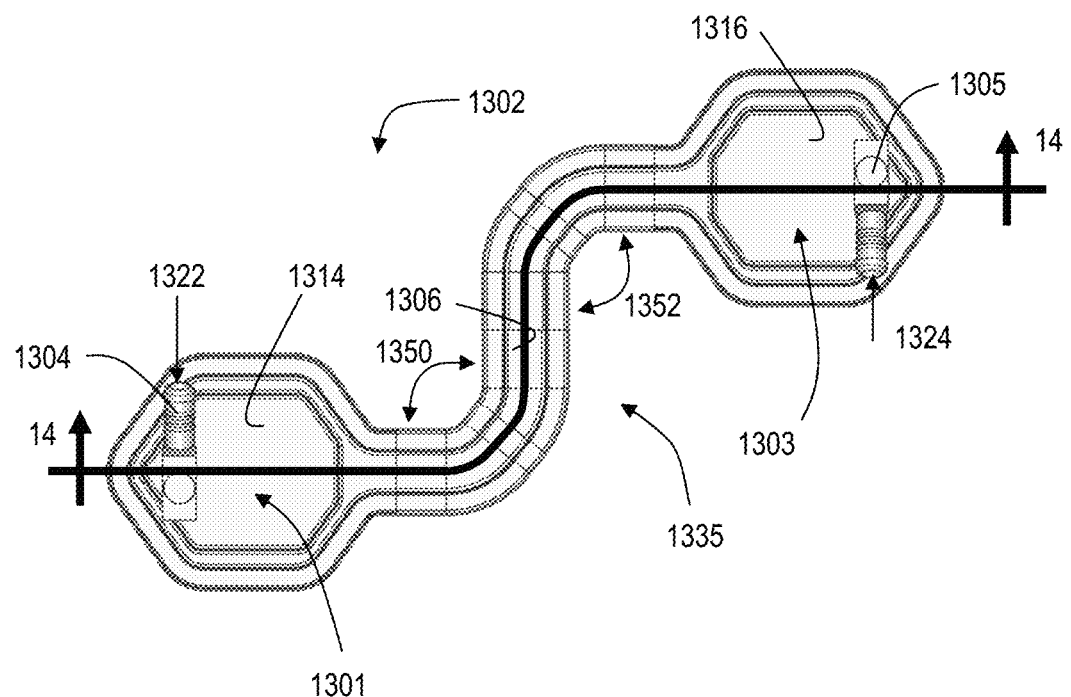
FIG. 13 shows a top view of a cold plate having multiple fin areas joined by multiple bends around axes perpendicular to the broadest surfaces of the fin areas, according to an exemplary embodiment.
Figure 14:
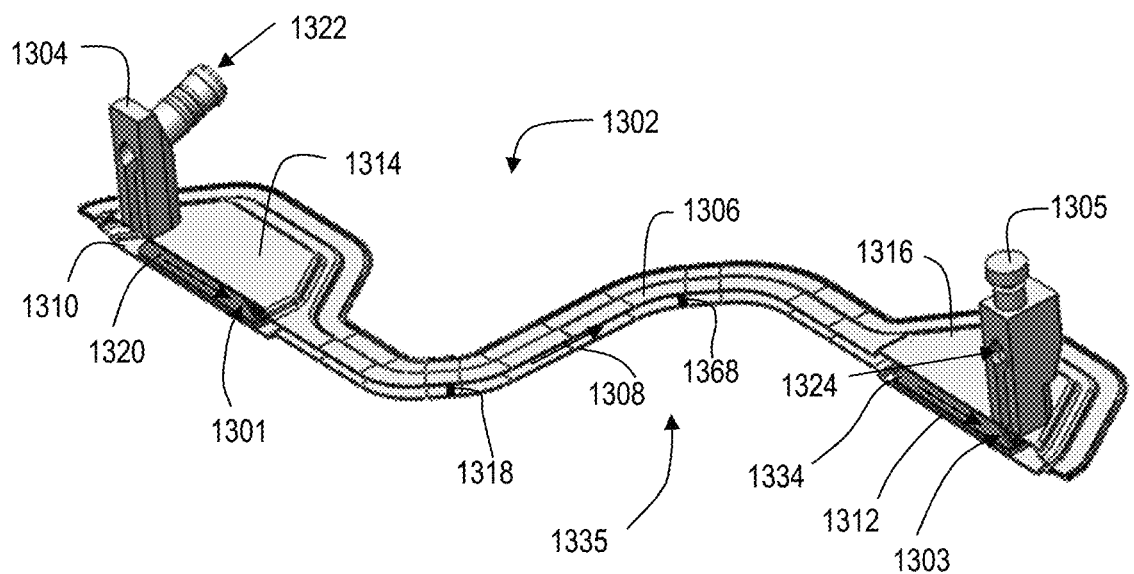
FIG. 14 shows a cross-sectional view of the cold plate of FIG. 13, taken along line 14-14 of FIG. 13.

FIG. 13 shows a top view of a cold plate 1302 that has multiple fin areas 1301, 1303 that are joined by a flex region 1335 with multiple bends 1350, 1352 around axes perpendicular to the broadest surfaces of the fin areas, according to an exemplary embodiment. FIG. 14 shows a cross-sectional view of the cold plate 1302 of FIG. 13. Features similar to those of the preceding figures are numbered similarly and are not further described in detail; elements numbered 13XX are analogous to the same elements numbered 9XX in FIG. 9 or 11XX in FIG. 11.

Figure 15:
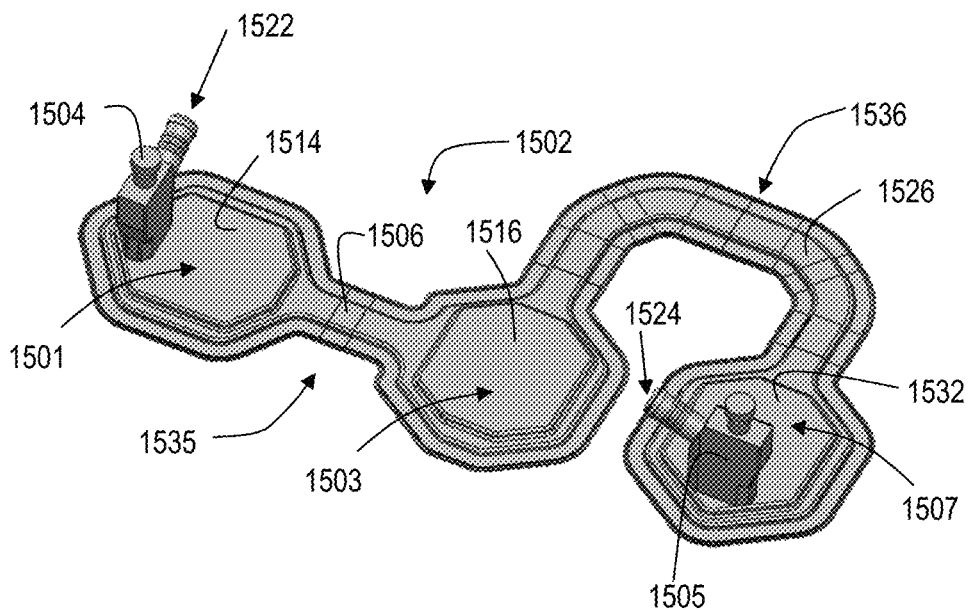
FIG. 15 shows a perspective view of a cold plate having multiple fin areas joined by multiple bends around axes perpendicular to the broadest surfaces of the fin areas, according to an exemplary embodiment.
Figure 16:
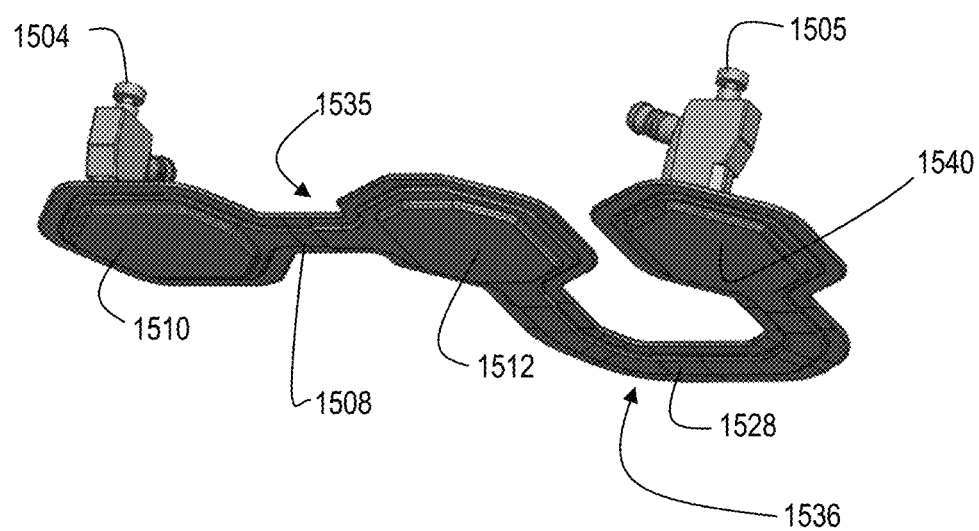
FIG. 16 shows a bottom perspective view of the cold plate of FIG. 15.

FIG. 15 shows a top perspective view of a cold plate 1502 that has multiple fin areas 1501, 1503, 1507 that are joined by multiple flex regions 1535, 1536 with bends around axes perpendicular to the broadest surfaces of the fin areas, according to an exemplary embodiment. FIG. 16 shows a bottom perspective view of the cold plate 1502 of FIG. 15. The cold plate 1502 comprises barb fittings 1504 and 1505, top wall 1506, 1514, 1516, 1526, and 1532, which can be one continuous sheet metal or separate sections and bottom wall 1508, 1510, 1512, 1528, and 1540, which can be made of one continuous sheet metal or separate sections. Features similar to those of the preceding figures are numbered similarly and are not further described in detail; elements numbered 15XX are analogous to the same elements numbered 9XX in FIG. 9, 11XX in FIG. 11, or 13XX in FIG. 13.

Figure 17:
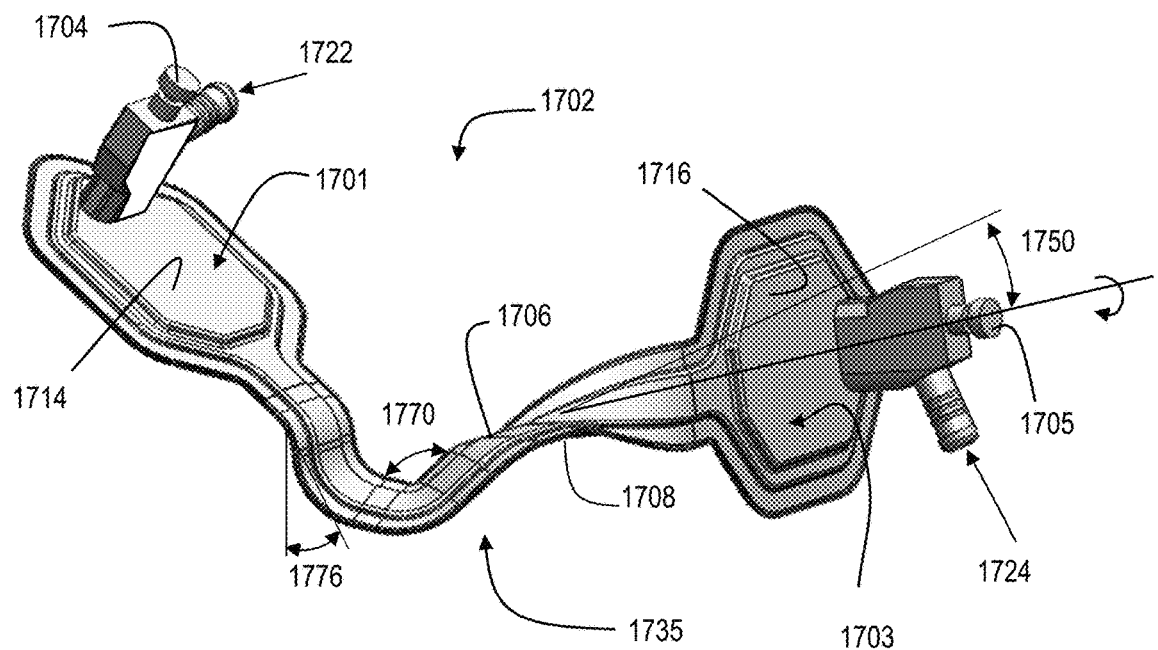
FIG. 17 shows a perspective view of a cold plate with multiple fin areas joined by a bend and a twist, according to an exemplary embodiment.

FIG. 17 shows a perspective view of a cold plate 1702 with multiple fin areas 1701, 1703 joined by a flex region 1735 that includes a twist 1750, a first bend 1770, and a second bend 1776, according to an exemplary embodiment. Features similar to those of the preceding figures are numbered similarly and are not further described in detail; elements numbered 17XX are analogous to the same elements numbered 9XX in FIG. 9, 11XX in FIG. 11, 13XX in FIG. 13, or 15XX in FIG. 15.

Figure 18:
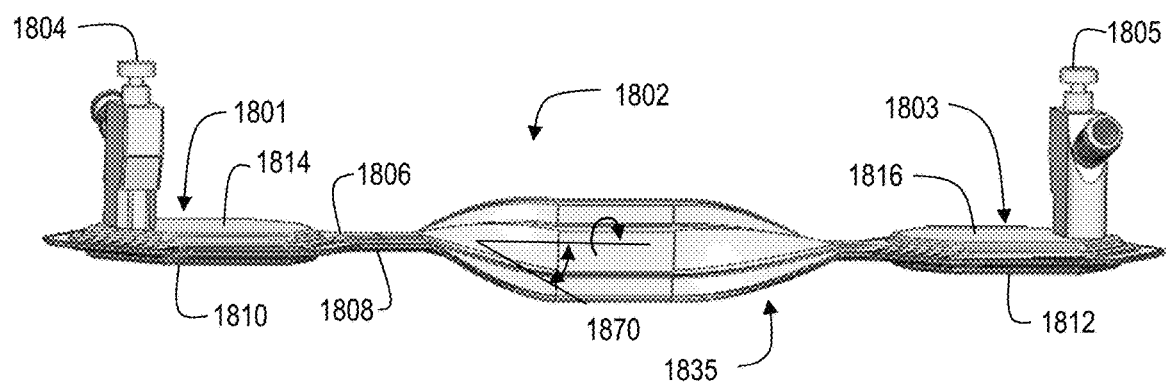
FIG. 18 shows a side view of a cold plate with multiple fin areas joined by a twist, according to an exemplary embodiment.

FIG. 18 shows a side view of a cold plate 1802 that has multiple fin areas 1801, 1803 that are joined by a twisted flex region 1835, according to an exemplary embodiment. Features similar to those of the preceding figures are numbered similarly and are not further described in detail; elements numbered 18XX are analogous to the same elements numbered 9XX in FIG. 9, 11XX in FIG. 11, or 13XX in FIG. 13. The flex region 1835 includes a 180 degree twist 1870 around an axis parallel to the broadest surfaces of the fin areas 1801, 1803.

Figure 19:
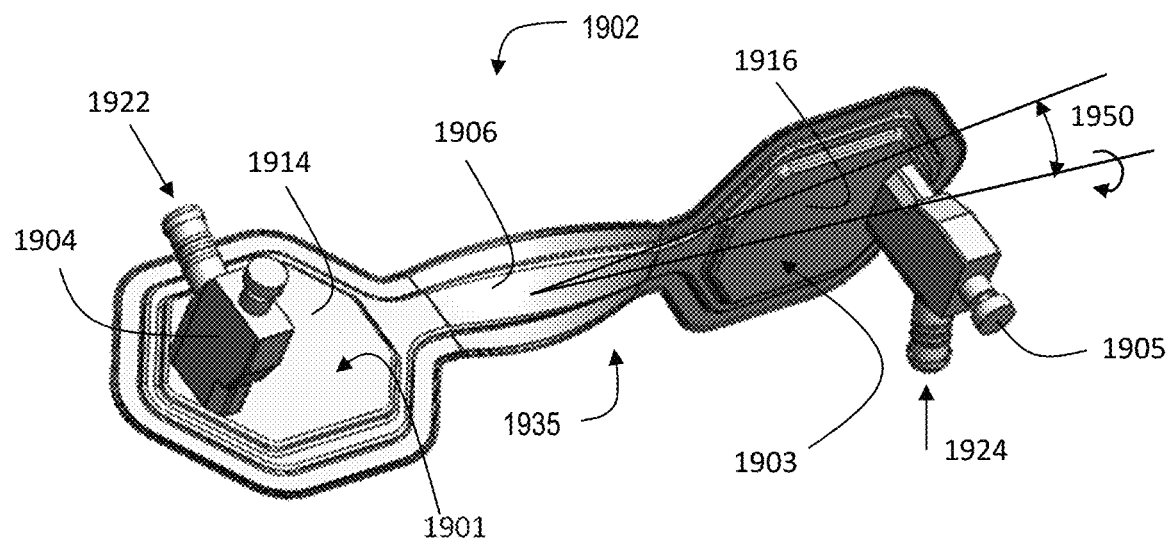
FIG. 19 shows a perspective view of a cold plate with multiple fin areas joined by a twist, according to an exemplary embodiment.

FIG. 19 shows a perspective view of a cold plate 1902 that has multiple fin areas 1901, 1903 joined by a twisted flex region 1935, according to an exemplary embodiment. Features similar to those of the preceding figures are numbered similarly and are not further described in detail; elements numbered 19XX are analogous to the same elements numbered 9XX in FIG. 9, 11XX in FIG. 11, or 13XX in FIG. 13. The flex region 1935 includes a 90 degree twist 1950 around an axis parallel to the broadest surfaces of the fin areas 1801, 1803

Figure 20:
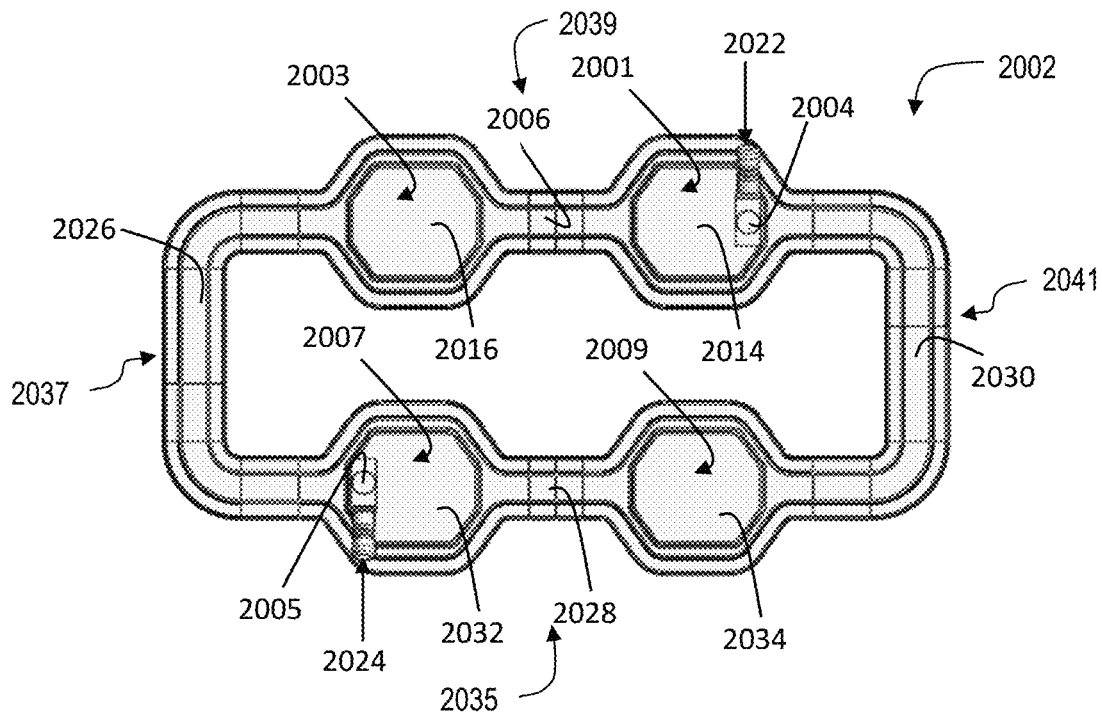
FIG. 20 shows a top view of a cold plate with multiple fin areas joined in a loop with bends out of the plane of the loop between the fin areas, according to an exemplary embodiment.

FIG. 20 shows a top view of a cold plate 2002 with multiple fin areas 2001, 2003, 2007, 2009 that are joined in a loop by a plurality of flex regions 2035, 2037, 2039, 2041 according to an exemplary embodiment. Features similar to those of the preceding figures are numbered similarly and are not further described in detail; elements numbered 20XX are analogous to the same elements numbered 9XX in FIG. 9, 11XX in FIG. 11, or 13XX in FIG. 13.

Figure 21:
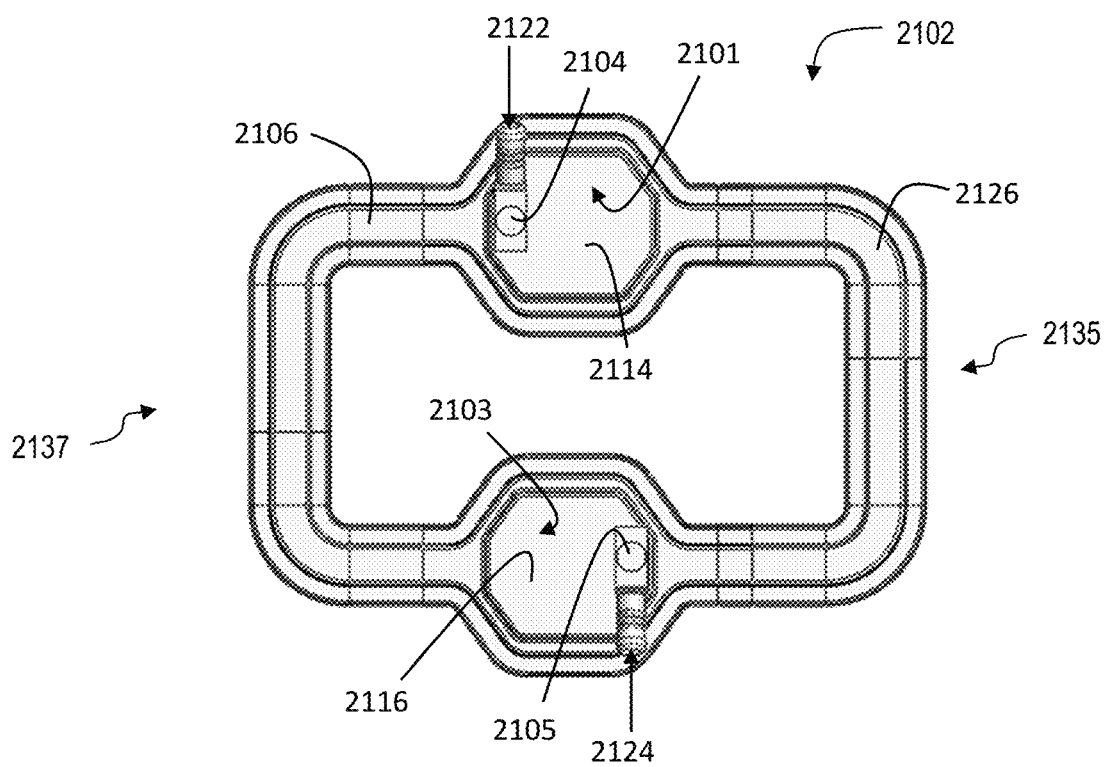
FIG. 21 shows a top view of a cold plate with multiple fin areas joined in a loop, according to an exemplary embodiment.

FIG. 21 shows a top view of a cold plate 2102 with multiple fin areas 2101, 2103 that are joined in a loop by a plurality of flex regions 2135, 2137, according to an exemplary embodiment. Features similar to those of the preceding figures are numbered similarly and are not further described in detail; elements numbered 21XX are analogous to the same elements numbered 9XX in FIG. 9, 11XX in FIG. 11, or 13XX in FIG. 13.

Note that barb fittings are exemplary and any suitable type of fitting can be employed; e.g., threaded, soldered, etc.

Given the discussion thus far, it will be appreciated that, in general terms, an exemplary apparatus 102, according to an aspect of the invention, includes a continuous top wall 106 and a continuous bottom wall 108. The top wall and the bottom wall define and enclose a first fin area 101; a second fin area 103; and a flex region 135 that joins the first fin area to the second fin area. The flex region is bent or twisted at a nonzero angle around at least one axis relative to the broadest surfaces of the first and second fin areas. The flex region and the fin areas are connected in fluid communication with each other. In one or more embodiments, one or more support posts 118 are disposed in the flex region, are connected to at least one of the top wall and the bottom wall, and hold the top wall apart from the bottom wall.

In one or more embodiments, the support posts are connected only to the bottom wall and leave the top wall free to deform in tension as the flex region is bent.

In one or more embodiments, the flex region is bent at least 90 degrees around at least one axis parallel to the broadest surfaces of the first and second fin areas.

In one or more embodiments, the flex region is bent 180 degrees so that the broadest surfaces of the first fin area and the second fin area face each other across a gap.

In one or more embodiments, the flex region is recurved so that the broadest surfaces of the first fin area and the second fin area are parallel and are offset from each other along a direction that is perpendicular to their areas.

In one or more embodiments, the flex region is formed as a fluid carrying manifold of hollowed cross section between the first fin area and the second fin area, and the first and second fin areas have hollowed cross sections that contain fin structures.

In another aspect, another exemplary apparatus 502 includes a top wall 506 and a bottom wall 508. The top wall and the bottom wall define and enclose a first fin area 501; a second fin area 503; and a flex region 535 that joins the first fin area to the second fin area. The flex region is bent at a nonzero angle around at least one axis parallel to the broadest surfaces of the first and second fin areas. The flex region and the fin areas are connected in fluid communication with each other.

In another aspect, another exemplary apparatus includes a continuous first wall 610; a continuous second wall 606; and a joint 660 connecting an edge 662 of the first wall to an edge 664 of the second wall. At the joint the edge of the first wall protrudes beyond the edge of the second wall and is bent to cover the edge of the second wall with space therebetween to accommodate solder or braze material 666.

In one or more embodiments, the first wall and the second wall enclose a first fin area therebetween. In one or more embodiments, the first wall and the second wall also enclose a second fin area and a flex region. The flex region fluidly connects the interior of the first fin area to the interior of the second fin area, and is bent or twisted around at least one axis relative to the broadest surfaces of the first and second walls.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus comprising:
a continuous top wall; and
a continuous bottom wall;
wherein the top wall and the bottom wall define and enclose:
 a first fin area;
 a second fin area; and
 a flex region that joins the first fin area to the second fin area;
wherein at the flex region the top and bottom walls are bent or twisted at a nonzero angle around at least one axis relative to the broadest surfaces of the first and second fin areas;
wherein the flex region and the fin areas are connected in fluid communication with each other.

2. The apparatus of claim 1 wherein the flex region is bent at least 90 degrees around at least one axis parallel to the broadest surfaces of the first and second fin areas.

3. The apparatus of claim 2 wherein the flex region is bent 180 degrees so that the broadest surfaces of the first fin area and the second fin area face each other across a gap.

4. The apparatus of claim 2 wherein the flex region is recurved so that the broadest surfaces of the first fin area and the second fin area are parallel and are offset from each other along a direction that is perpendicular to their areas.

5. An apparatus comprising:
a continuous top wall; and
a continuous bottom wall;
wherein the top wall and the bottom wall define and enclose:
 a first fin area;
 a second fin area; and a flex region that joins the first fin area to the second fin area;
wherein at the flex region the top and bottom walls are bent or twisted at a nonzero angle around at least one axis relative to the broadest surfaces of the first and second fin areas;
wherein the flex region and the fin areas are connected in fluid communication with each other;
wherein the flex region includes one or more support posts that are connected to at least one of the top wall and the bottom wall and that hold the top wall apart from the bottom wall.

6. The apparatus of claim 5 wherein the support posts are connected only to the bottom wall and leave the top wall free to deform in tension as the flex region is bent.

7. An apparatus comprising:
a continuous top wall; and
a continuous bottom wall;
wherein the top wall and the bottom wall define and enclose:
a first fin area;
a second fin area;
a flex region that joins the first fin area to the second fin area; and
one or more support posts that are disposed in the flex region, that are connected to at least one of the top wall and the bottom wall, and that hold the top wall apart from the bottom wall;
wherein the flex region and the fin areas are connected in fluid communication with each other.

8. The apparatus of claim 7 wherein the support posts are connected only to the bottom wall and leave the top wall free to deform in tension as the flex region is bent.

9. The apparatus of claim 7 wherein the flex region is bent at least 90 degrees around at least one axis parallel to the broadest surfaces of the first and second fin areas.

10. The apparatus of claim 7 wherein the flex region is bent 180 degrees so that the broadest surfaces of the first fin area and the second fin area face each other across a gap.

11. The apparatus of claim 7 wherein the flex region is recurved so that the broadest surfaces of the first fin area and the second fin area are parallel and are offset from each other along a direction that is perpendicular to their areas.

12. The apparatus of claim 7 wherein the flex region is formed as a hollow fluid carrying manifold between the first fin area and the second fin area, and wherein the flex region can be flexed or bent in at least one dimension.

13. An apparatus comprising:
a continuous first wall;
a continuous second wall; and
a joint that connects an edge of the first wall to an edge of the second wall,
wherein at the joint, the edge of the first wall protrudes beyond the edge of the second wall and is bent to cover the edge of the second wall with space therebetween to accommodate solder or braze material.

14. The apparatus of claim 13 wherein the first wall and the second wall enclose a first fin area therebetween.

15. The apparatus of claim 14 wherein the first wall and the second wall also enclose a second fin area and a flex region,
wherein the flex region fluidly connects the interior of the first fin area to the interior of the second fin area, and is bent or twisted around at least one axis relative to the broadest surfaces of the first and second walls.

16. The apparatus of claim 15 further comprising one or more support posts that are disposed in the flex region, that are connected to at least one of the top wall and the bottom wall, and that hold the top wall apart from the bottom wall.

17. The apparatus of claim 16 wherein the support posts are connected only to the bottom wall and leave the top wall free to deform in tension as the flex region is bent.

18. The apparatus of claim 15 wherein the flex region is bent at least 90 degrees around at least one axis parallel to the broadest surfaces of the first and second fin areas.

19. The apparatus of claim 15 wherein the flex region is bent 180 degrees so that the broadest surfaces of the first fin area and the second fin area face each other across a gap.

20. The apparatus of claim 15 wherein the flex region is recurved so that the broadest surfaces of the first fin area and the second fin area are parallel and are offset from each other along a direction that is perpendicular to their areas.

* * * * *